US006987409B2

(12) United States Patent
Kim et al.

(10) Patent No.: US 6,987,409 B2
(45) Date of Patent: Jan. 17, 2006

(54) ANALOG DELAY LOCKED LOOP WITH TRACKING ANALOG-DIGITAL CONVERTER

(75) Inventors: Se-Jun Kim, Ichon-shi (KR); Sang-Hoon Hong, Ichon-shi (KR); Jae-Bum Ko, Ichon-shi (KR)

(73) Assignee: Hynix Semiconductor Inc., (KR)

( * ) Notice: Subject to any disclaimer, the term of this patent is extended or adjusted under 35 U.S.C. 154(b) by 0 days.

(21) Appl. No.: 10/749,448

(22) Filed: Dec. 31, 2003

(65) Prior Publication Data

US 2004/0160250 A1 Aug. 19, 2004

(30) Foreign Application Priority Data

Jan. 9, 2003 (KR) ...................... 10-2003-0001287

(51) Int. Cl.
H03L 7/06 (2006.01)

(52) U.S. Cl. ...................... 327/158; 327/149; 327/161

(58) Field of Classification Search ........ 327/153–155, 327/158, 159, 161–163, 165, 141, 144, 149, 327/152, 261, 269, 270, 271, 276–278, 284, 327/291; 331/1 A, 12, 25, 1 R; 375/373–376
See application file for complete search history.

(56) References Cited

U.S. PATENT DOCUMENTS

| | | | | |
|---|---|---|---|---|
| 4,803,705 A | * | 2/1989 | Gillingham et al. | ........ 375/375 |
| 5,355,098 A | * | 10/1994 | Iwasaki | ......................... 331/14 |
| 5,389,899 A | * | 2/1995 | Yahagi et al. | .................. 331/10 |
| 5,926,515 A | * | 7/1999 | Park | ............................ 375/376 |
| 6,154,073 A | * | 11/2000 | Choi | ........................... 327/161 |
| 6,211,747 B1 | * | 4/2001 | Trichet et al. | .............. 332/128 |
| 6,275,079 B1 | * | 8/2001 | Park | ........................... 327/143 |
| 6,392,456 B1 | * | 5/2002 | Pyeon et al. | ................ 327/156 |
| 6,407,596 B1 | | 6/2002 | Taft et al. | |
| 6,518,807 B1 | | 2/2003 | Cho | |
| 6,628,154 B2 | * | 9/2003 | Fiscus | ........................ 327/158 |
| 6,774,679 B2 | * | 8/2004 | Nogami | ......................... 327/3 |
| 6,834,183 B2 | * | 12/2004 | Black et al. | ............. 455/182.1 |

FOREIGN PATENT DOCUMENTS

| | | |
|---|---|---|
| JP | 2003-110423 | 4/2003 |
| KR | 1020020067137 | 8/2002 |

* cited by examiner

*Primary Examiner*—Timothy P. Callahan
*Assistant Examiner*—Hai L. Nguyen
(74) *Attorney, Agent, or Firm*—Blakely, Sokoloff, Taylor & Zafman (57) ABSTRACT

An analog DLL device includes a delay model for modeling delay time for buffering the external clock signal; a phase comparator for comparing a phase of the reference clock signal with an phase of an outputted signal from the delay model; a charge pump for pumping charges; a loop filter for generating a reference voltage; a voltage control delay line and a tracking digital-analog converter which converts the reference voltage to a digital value; and stores the digital value for keeping the reference voltage safely.

18 Claims, 9 Drawing Sheets

ANALOG DELAY LOCKED LOOP WITH TRACKING ANALOG-DIGITAL CONVERTER

FIELD OF INVENTION

The present invention relates to a semiconductor memory device; and, more particularly, to an analog delay locked loop (DLL) device which synchronizes an external clock with an internal clock.

DESCRIPTION OF PRIOR ART

A synchronous semiconductor memory device which is operated synchronizing with an external clock signal generates an internal clock signal by using a clock buffer and a clock driver. The internal clock signal is generated by delaying the external clock signal. Thus, an operating performance of the synchronous semiconductor memory device is lowered.

Therefore, the synchronous semiconductor memory device is provided with a DLL device for synchronizing the internal clock signal with the external clock signal. Generally, there are two different types of the DLL device, an analog DLL device and a digital DLL device.

Figure 1:
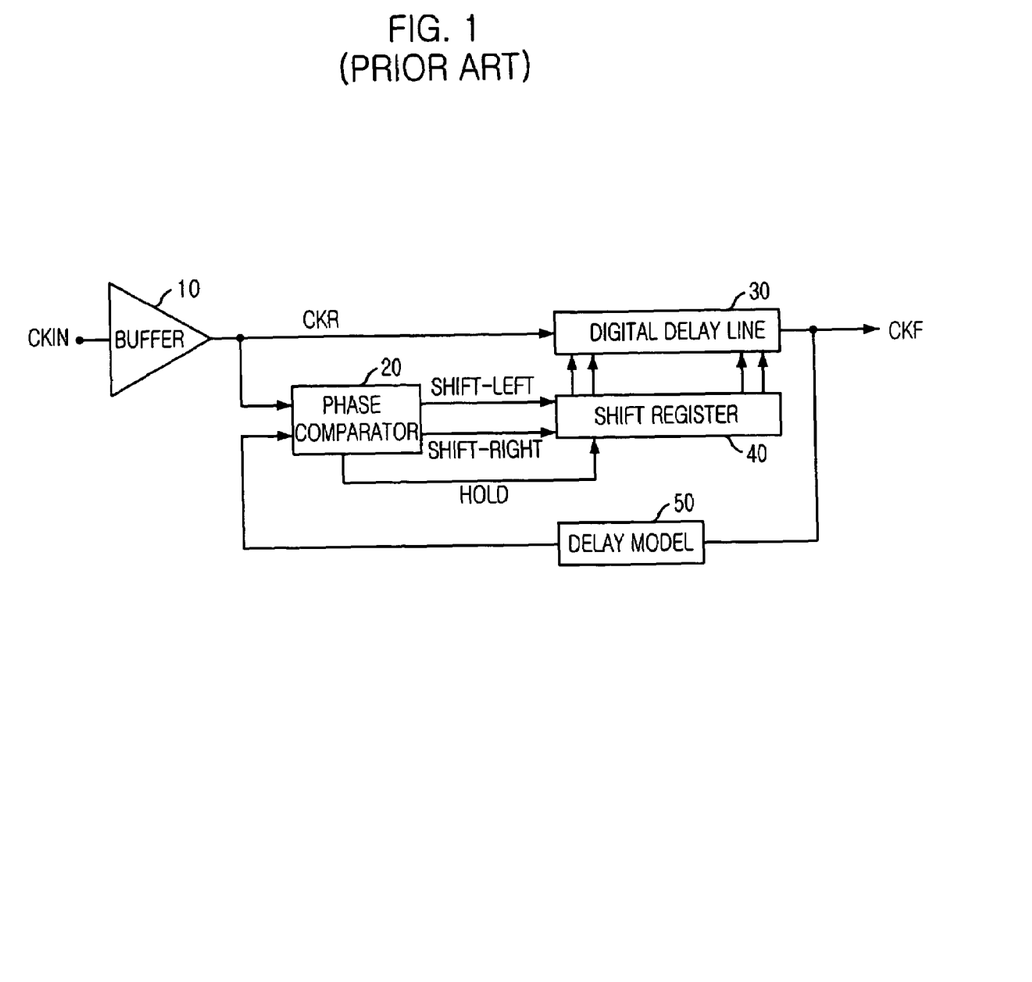
FIG. 1 is a block diagram describing a conventional digital delay locked loop (DLL) device.

FIG. 1 is a block diagram of a convention digital DLL device.

As shown, the digital DLL device includes a delay model 50, a phase comparator 20, a buffer 10, a shift register 40 and a digital delay line 30. The delay model 50 is made for modeling a delay time as long as an external clock signal CKIN passes throughout the buffer 10. The phase comparator 20 compares a phase of the reference clock signal CKR and a phase of an outputted signal from the delay model 50, and controls delay time of the reference clock signal CKR. The shift register 40 receives a shift-left signal SHIFT-LEFT or a shift-right signal SHIFT-RIGHT from the phase comparator 20, and controls the delay line 30 by using of the shift-left signal SHIFT-LEFT or the shift-right signal SHIFT-RIGHT. Namely, delay time of the digital delay line 30 is controlled depending on outputted signals from the shift register 40.

Figure 2:
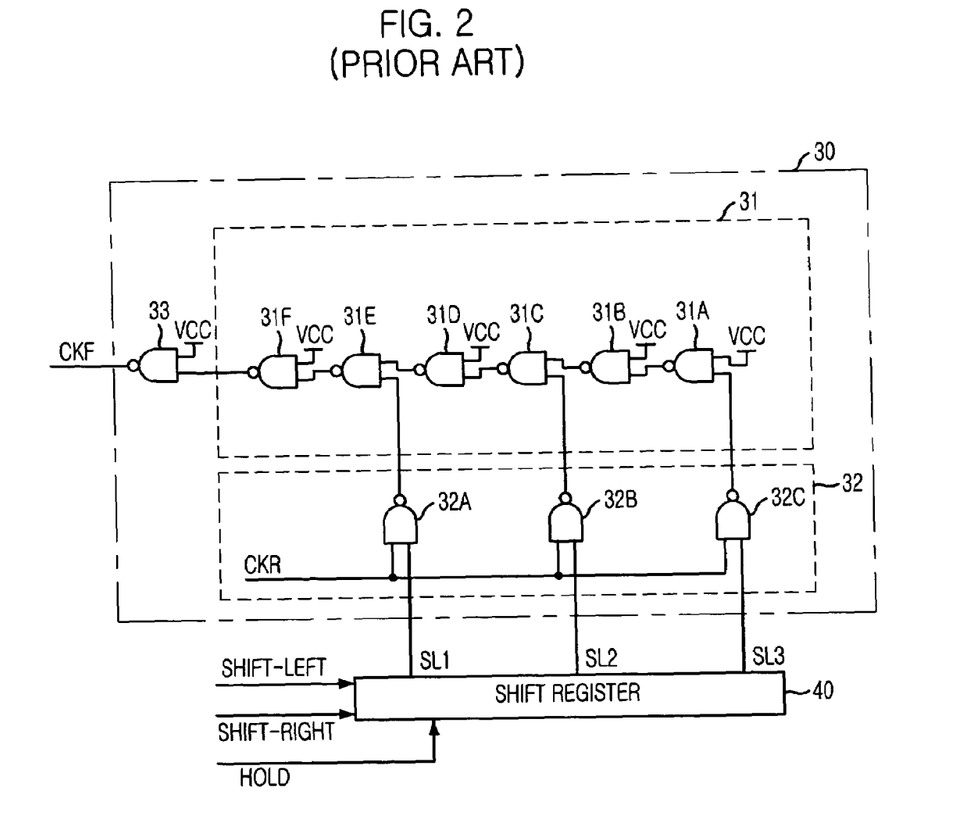
FIG. 2 is a schematic circuit diagram depicting a digital delay line shown in FIG. 1.

FIG. 2 is a schematic circuit diagram depicting the digital delay line 30 shown in FIG. 1, where the digital delay line 30 has three unit delays.

As shown, the digital delay line 30 includes a control unit 32, a delay unit 31 and an output unit 33. The control unit 32 controlled by a first shift signal SL1, a second shift signal SL2 and a third shift signal SL3 delivers the reference clock signal CKR to the delay unit 31. Herein, the first to third shift signals SL1 to SL3 are outputted from the shift register 40. The delay unit 30 delays the reference clock signal CKR for a predetermined time, where the predetermined time is determined by the number of unit delays included in the control unit 32. The output unit 33 outputs a signal outputted from the delay unit 31.

The control unit 32 includes three NAND gates: a first NAND gate 32A which receives the reference clock signal CKR and the first shift signal SL1, a second NAND gate 32B which receives the reference clock signal CKR and the second shift signal SL2 and a third NAND gate 32C which receives the reference clock signal CKR and the third shift signal SL3.

The delay unit 31 includes three unit delays, a first unit delay, a second unit delay and a third unit delay.

The first unit delay is constituted of a NAND gate 31A and a NAND gate 31B, where the NAND gate 31A and the NAND gate 31B receive a power voltage VCC, the NAND gate 31A receives an outputted signal from the NAND gate 32C, and the NAND gate 31B receives an outputted signal from the NAND gate 31A.

The second unit delay is constituted of a NAND gate 31C and a NAND gate 31D, where the NAND gate 31C receives outputted signals from the NAND gate 32B and the NAND gate 31B, and the NAND gate 31D receives the power voltage VCC, and receives an outputted signal from the NAND gate 31C.

The third unit delay is constituted of a NAND gate 31E and a NAND gate 31F, where the NAND gate 31E receives outputted signals from the NAND gate 32A and the NAND gate 31D, and the NAND gate 31F receives the power voltage VCC, and receives an outputted signal from the NAND gate 31E.

In case of the delay unit 31 shown in FIG. 2, the delay unit 31 includes three unit delays and each unit delay has two NAND gates. The number of unit delays and the number of NAND gates included in each of the unit delays determine total delay time while the reference clock signal CKR passes the digital delay line 30.

Referring to FIGS. 1 and 2, an operation of the digital DLL device is described hereinafter.

The external clock signal CKIN is delayed for a predetermined time during passing the buffer 10, and the buffer 10 outputs the reference clock signal CKR, where the reference clock signal CKR is generated by delaying the external clock signal CKIN for the predetermined time. The reference clock signal CKR is inputted to the phase comparator 20 and the digital delay line 30. The digital delay line 30 delays the reference clock signal CKR for a predetermined time, and outputs a feedback clock signal CKF which is generated by delaying the reference clock signal CKR for the predetermined time. The feedback clock signal CKR is inputted to the delay model 50 which is designed by modeling a delay time the external clock signal CKIN takes during passing the buffer 10.

The phase comparator 20 outputs the shift-right signal SHIFT-RIGHT or the shift-left signal SHIFT-LEFT after comparing the reference clock signal CKR with an outputted signal from the delay model 50, and the shift-right signal SHIFT-RIGHT or the shift-left signal SHIFT-LEFT is inputted to the shift register 40. The shift register 40 outputs the first shift signal SL1, the second shift signal SL2 and the third shift signal SL3 depending on the shift-right signal SHIFT-RIGHT or the shift-right signal SHIFT-RIGHT, and the three shift signals, SL1, SL2 and SL3, are inputted to the delay line 30.

Thereafter, the digital delay line 30 generates the feedback clock signal CKF by delaying the reference clock signal CKR for delay time, where the delay time is determined by the first to third shift signals SL1 to SL3; and, then, the feedback clock signal CKF is inputted to the delay model 50.

Thereafter, the delay model 50 outputs the feedback clock signal CKF to the phase comparator 20, and the comparator 20 compares the reference clock signal CKR with the outputted signal from the delay model 50.

If the phase comparator 20 detects that a phase of the reference clock signal CKR is equal to a phase of the outputted signal from the delay model 50, the phase comparator 20 generates a hold signal HOLD and inputs the hold signal HOLD to the shift register 40 for holding delay time while the reference clock signal CKF is transferred to the feedback clock signal CKF.

Thereafter, an internal path of the delay line 30 is locked, and the delay locked feedback clock signal CKF is inputted to an internal circuit of the semiconductor memory device.

The digital delay locked loop device stores a delay locked value in the shift register 50, and becomes in a standby mode. Therefore, once the DLL is locked, the digital DLL device can reduce power consumption by preventing an external clock signal from entering a delay line in the standby mode. If the standby mode is ended, when the feedback clock signal CKF is not synchronized with the external clock signal CKIN, the digital DLL can synchronize the feedback clock signal CKF with the external clock signal CKIN again within few clocks by using the stored delay locked value.

Therefore, the digital DLL has a merit of reducing the power consumption by disabling the digital delay line 30 in the standby mode.

However, since performance of the digital DLL device depends on the number of the unit delays included in the delay line 30, the number of the unit delays should be increased to improve performance. Therefore, the increased number of the delaying units causes a bigger size of the digital DLL device.

The digital DLL device also has other problems. The digital DLL device cannot tune delay time minutely because a unit delay time of each delaying unit is the minutest value the digital DLL device can tune. In the digital DLL device, a lot of jitter are generated during operation because clock signals should pass through many logic gates.

The problems of the digital DLL device can be solved by using the analog DLL device.

Figure 3:
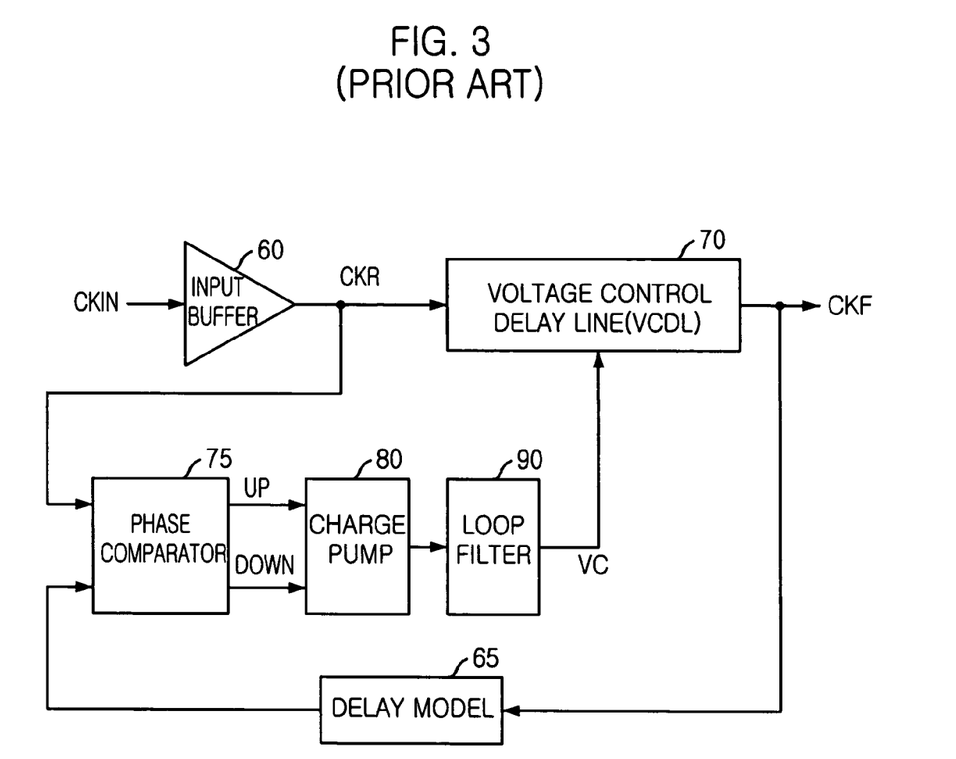
FIG. 3 is a block diagram of a conventional analog DLL device.

FIG. 3 is a block diagram showing the analog DLL device.

As shown, the analog DLL device includes a delay model 65, a voltage control delay line (VCDL) 70, a phase comparator 75, a charge pump 80 and a loop filter 90.

The delay model 65 is for modeling delay time an external clock signal CKIN takes during passing through an input buffer 60. The voltage control delay line 70 generates a feedback clock signal CKF by delaying a reference clock signal CKR outputted from the input buffer 60 for a predetermined delay time, where the predetermined delay time is determined by a reference voltage VC. The phase comparator 75 generates an up signal UP and a down signal DOWN after comparing a phase of the reference clock signal CKR with a phase of an outputted signal from the delay model 65. The charge pump 80 pumps charges to the loop filter 90 depending on the up signal UP and the down signal DOWN. The loop filter 90 stores the pumped charges, and outputs the reference voltage VC to the voltage control delay line 70, where the reference voltage VC corresponds to the stored charges.

Figure 4:
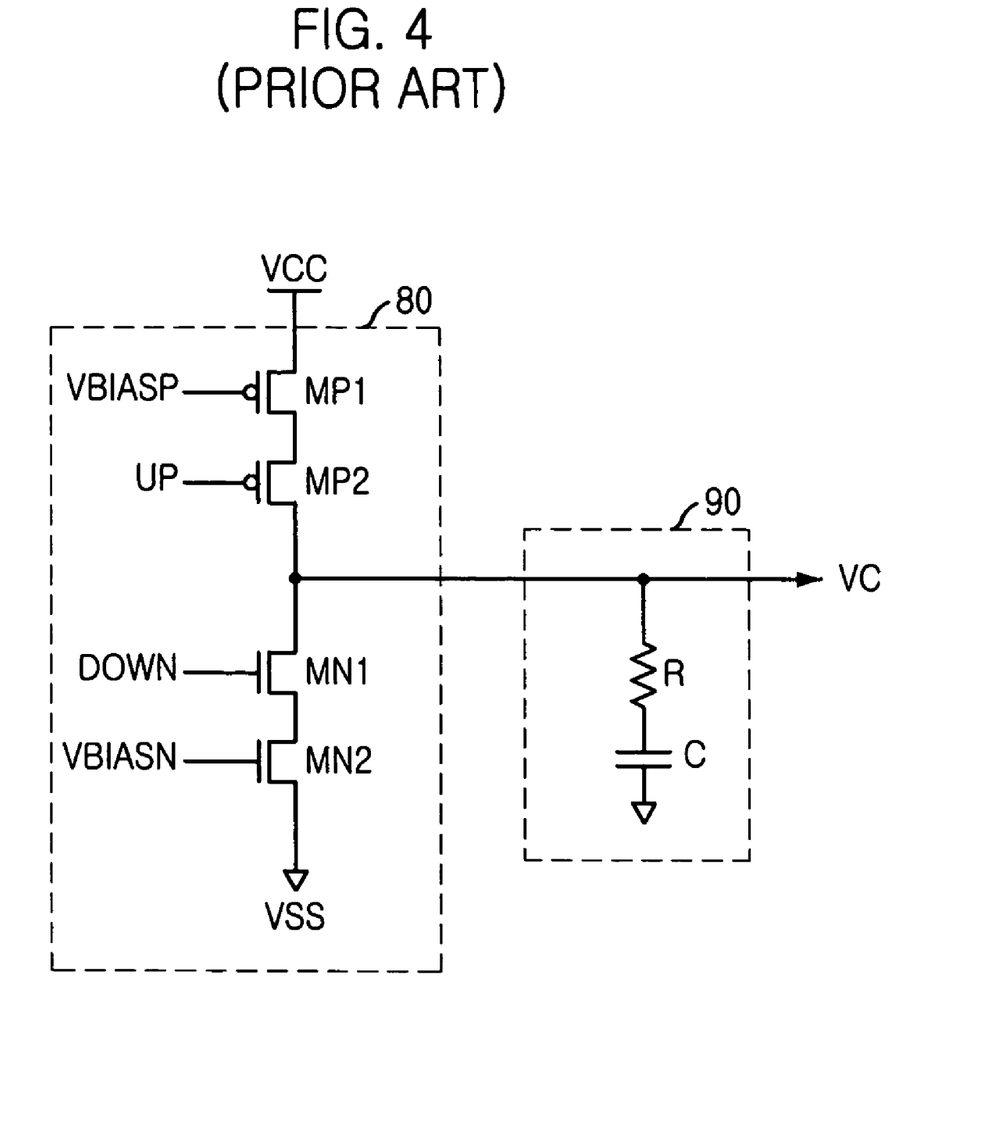
FIG. 4 shows a schematic circuit diagram of a conventional charge pump and a conventional loop filter shown in FIG. 3.

FIG. 4 shows a schematic circuit diagram describing the charge pump 80 and the loop filter 90 in the analog DLL device.

As shown, the charge pump 80 includes a first MOS transistor MP1, a second MOS transistor MP2, a third MOS transistor MN1 and the fourth MOS transistor MN2.

The first MOS transistor is supplied with power voltage VCC and a first bias voltage VBIASP. The drain of the second MOS transistor MP2 is connected to the source of the first MOS transistor MP1, and the gate of the second MOS transistor MP2 receives the up signal UP. The drain of the third MOS transistor MN1 is connected to the source of the second MOS transistor MP2, and the gate of the third MOS transistor MN1 receives the down signal DOWN. The drain of the fourth MOS transistor MN2 is connected to the source of the third MOS transistor MN1, and the gate of the fourth MOS transistor MN2 is supplied with a second bias voltage VBIASN, and the source of the fourth MOS transistor MN2 is connected to a ground voltage.

The loop filter 90 includes a capacitor C and a resistor R, where the capacitor C stores charges pumped from the charge pump 80 and the resistor R carries the charges to the capacitor C.

Referring to FIGS. 3 and 4, an operation of the analog DLL device is described below.

The external clock signal CKIN is delayed for the predetermined time by an input buffer 60, and the input buffer 60 outputs the delayed external clock signal CKIN as the reference clock signal CKR. The reference clock signal CKR is inputted to the phase comparator 75 and the voltage control delay line 70. The voltage control delay line 70 delays the reference clock signal CKR for a predetermined time, and outputs the delayed reference clock signal CKR as the feedback clock signal CKF. The feedback clock signal CKR is inputted to the delay model 65 which is designed by modeling a delay time as long as the external clock signal CKIN is delayed by the input buffer 60.

Thereafter, the phase comparator 75 generates the up signal UP and the down signal DOWN after comparing a phase of the reference clock signal CKR with a phase of an outputted signal from the delay model 65.

The charge pump 80 enabled by the first bias voltage VBIASP and the second bias voltage VBIASN charges or discharges the capacitor C of the loop filter 90 depending on the up signal UP and the down signal DOWN. The reference voltage VC is delivered to the voltage control delay line 70, where the reference voltage VC is determined by quantity of charges which is charged in the capacitor C.

Thereafter, the voltage control delay line 70 generates the feedback clock signal CKF by delaying the reference clock signal CKR for delay time, where the delay time is determined by the reference voltage VC.

Thereafter, if a phase of the reference clock signal CKR is equal to that of an outputted signal from the delay model 65, the phase comparator 75 does not output the up signal UP or the down signal DOWN, thereby the reference voltage VC is fixed.

Therefore, after the reference voltage VC is fixed, the voltage control delay line 70 delays the reference clock signal CKR for fixed delay time, and outputs the delayed reference clock signal CKR as the feedback clock signal CKF, then, the feedback clock signal CKF is inputted to the internal circuit of a semiconductor memory device.

As described above, the analog DLL device can tune a delay time minutely if the reference voltage VC could be controlled minutely.

Therefore, an internal clock signal of a semiconductor memory device can be precisely synchronized with an external clock signal by using the analog DLL device, and the analog DLL device has low jitter, and is proper for a high speed system.

However, since a delay value is referenced on charge quantity in a capacitor, there is a problem that the reference voltage VC is not stable due to a leakage current of the capacitor. Therefore, for keeping the delay value, the analog DLL should continuously operate even after the delay value of the analog DLL is locked; and, subsequently, a lot of power is consumed.

SUMMARY OF INVENTION

It is, therefore, an object of the present invention is to provide an analog delay locked loop (DLL) which operates at high speed and low power consumption.

In accordance with an aspect of the present invention, there is provided an analog DLL which buffers an external clock signal, and uses the buffered clock signal as a reference clock signal including a delay model for modeling delay time for buffering the external clock signal; a phase comparator for comparing an phase of the reference clock signal with an phase of an outputted signal from the delay model; a charge pump for pumping charges in response to an outputted signal from the phase comparator; a loop filter for generating a reference voltage which is determined by a quantity of charges inputted from the charge pump; a voltage control delay line which delays the reference clock signal for a predetermined time, and outputs the delayed clock signal to the delay model, where the predetermined time is determined by the reference voltage; and a tracking analog-digital converter which converts the reference voltage to a digital value, and stores the digital value for keeping the reference voltage safely, and outputs a tracking voltage which corresponds to the digital value to the loop filter.

In accordance with an aspect of the present invention, there is also provided an analog phase locked loop (PLL) which buffers an external clock signal, and uses the buffered clock signal as a reference clock signal; a delay model for modeling delay time for buffering the external clock signal; a phase comparator for comparing an phase of the reference clock signal with an phase of an outputted signal from the delay model; a charge pump for pumping charges in response to an outputted signal from the phase comparator; a loop filter for generating a reference voltage which is determined by a quantity of charges inputted from the charge pump; a voltage control oscillator which modulates a frequency of the reference clock signal, and outputs the modulated signal to the delay model; and a tracking analog-digital converter which converts the reference voltage to a digital value, and stores the digital value for keeping the reference voltage safely, and outputs a tracking voltage which corresponds to the digital value to the loop filter.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, an analog delay locked loop (DLL) device in accordance with the present invention will be described in detail referring to the accompanying drawings.

Figure 5:
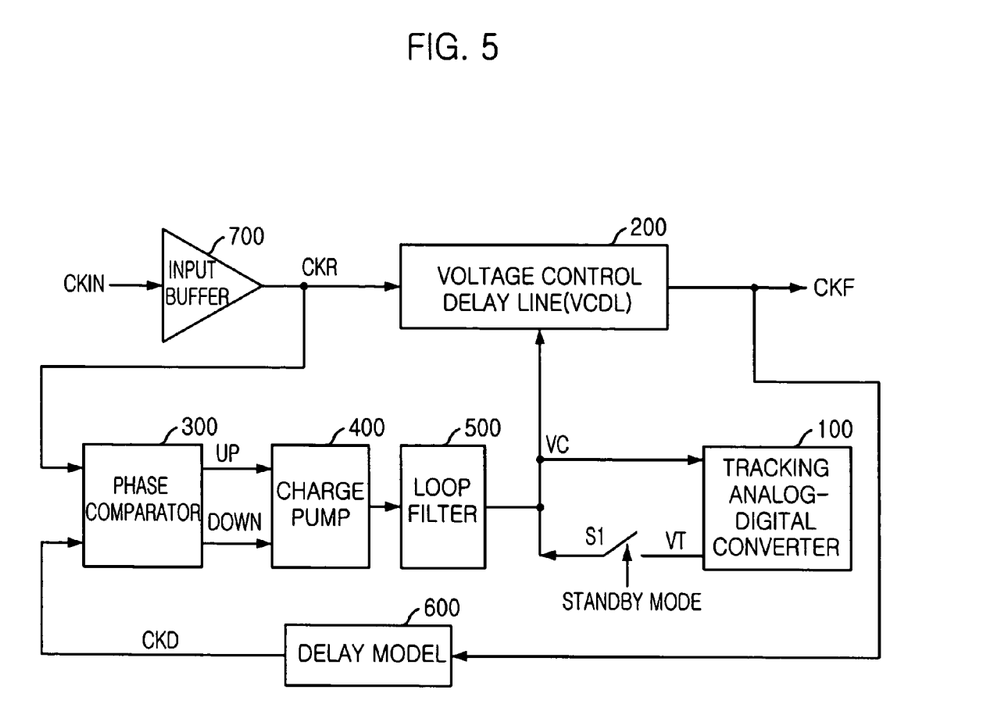
FIG. 5 is a block diagram showing an analog DLL device in accordance with the present invention.

FIG. 5 is a block diagram showing the analog DLL device in accordance with an embodiment of the present invention.

As shown, the analog DLL includes a delay model 600, a phase comparator 300, a charge pump 400, a loop filter 500, a voltage control delay line 200, a tracking digital-analog converter 100 and an input buffer 700.

The delay line 600 is for modeling delay time when an external clock signal CKIN passes through the input buffer 700. The phase comparator 300 compares a phase of a reference clock signal CKR with a phase of a delay clock signal CKD outputted from the delay model 600, and the charge pump 400 pumps charges to the loop filter 500 in response to outputted signals from the phase comparator 300. The loop filter 500 generates a reference voltage VC which is determined by amount of charges in the charge pump 400. The voltage control delay line 200 generates a feedback clock signal CKF by delaying the reference clock signal CKR outputted from the input buffer 700 for a predetermined delay time, where the predetermined delay time is determined by the reference voltage VC. The tracking digital-analog converter 100 stores a value of the reference voltage VC as a digital value, and outputs a tracking voltage VT which corresponds to the stored digital value.

The tracking voltage VT keeps a voltage value of the reference voltage VC during a standby mode, and the loop filter 500 has a capacitor (not shown) for storing the reference voltage VC.

The tracking digital-analog converter 100 has a switch S1 for delivering the tracking voltage to the loop filter 500.

Figure 6:
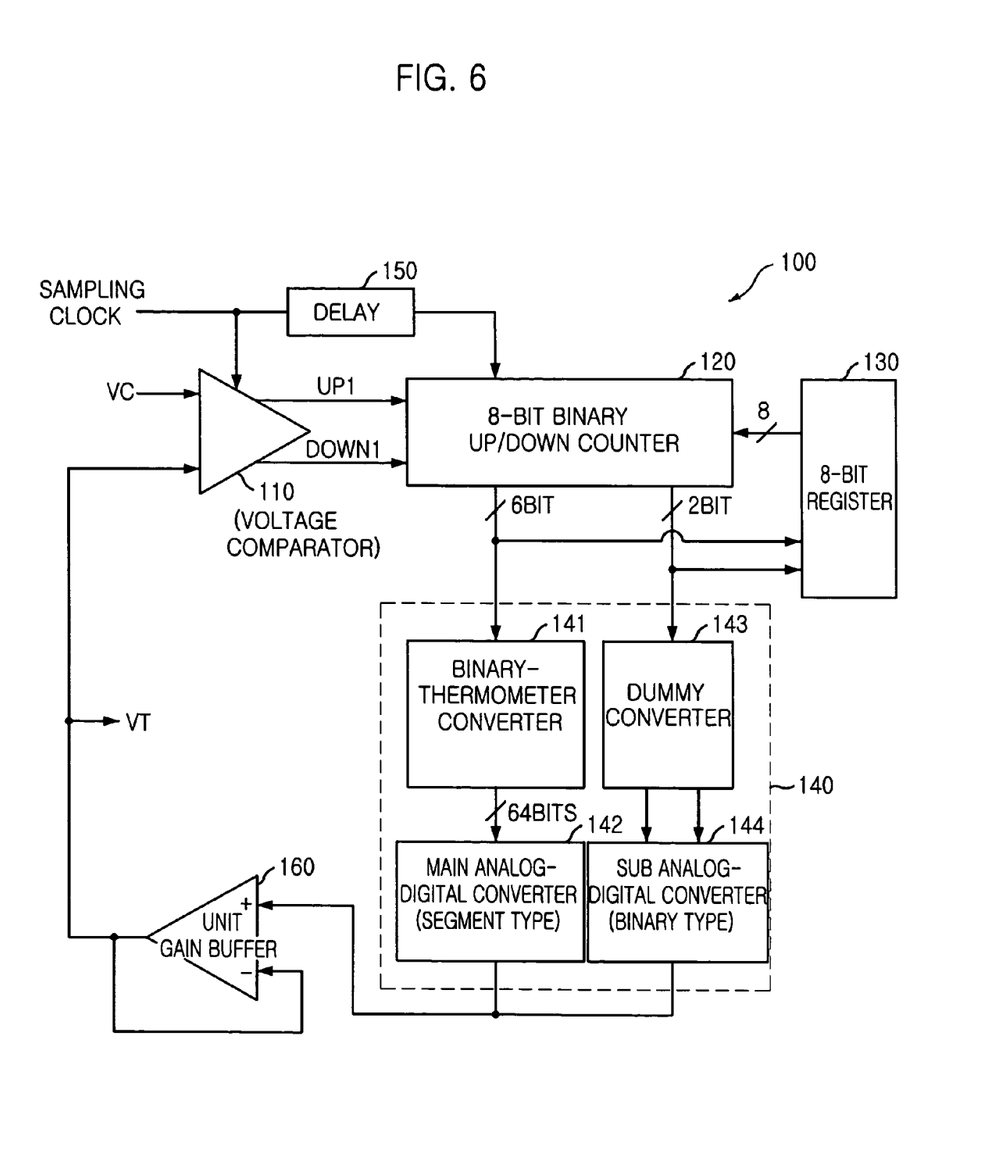
FIG. 6 is a block diagram of a tracking analog-digital converter shown in FIG. 5.

FIG. 6 is a block diagram of the tracking digital-analog converter 100.

As shown, the tracking digital-analog converter 100 includes a voltage comparator 110, an 8-bit binary up/down counter 120, an 8-bit register 130, an digital-analog converter 140, a delay 150 and a unit gain buffer 160.

The voltage comparator 110 compares the reference voltage VC with the tracking voltage VT, and the 8-bit binary up/down counter 120 outputs counting signal in response to outputted signals from the voltage comparator 110. The 8-bit register 130 stores a digital value outputted from the 8-bit binary up/down counter 120. The digital-analog converter 140 generates the tracking voltage VT which corresponds to a digital value stored in the 8-bit register 130.

The digital-analog converter 140 includes a main digital-analog converter 142, a sub digital-analog converter 144, a binary-thermometer code converter 141 and a dummy converter 143.

The main digital-analog converter 142 generates a first tracking voltage which corresponds to upper 6 bits stored in the 8-bit register 130. Likewise, the sub digital-analog converter 144 generates a second tracking voltage which corresponds to lower 2 bits stored in the 8-bit register 130. The second tracking voltage is used for correcting the first tracking voltage to be equal to the reference voltage VC.

The binary-thermometer code converter 141 converts upper 6 bits of 8-bit signal outputted from the 8-bit binary up/down counter 120 into a 64-bit thermometer code, and outputs the 64-bit thermometer code to the main digital-analog converter 142.

The dummy converter 143 delays lower 2 bits of an 8-bit signal outputted from the 8-bit binary up/down counter 120 for predetermined delay time, and outputs the delayed 2-bit signal to the sub digital-analog converter 144. The predetermined delay time is equal to the time the binary-thermometer code converter 141 takes to convert the upper 6-bit signal to the 64-bit thermometer code.

The following Table. 1 shows a thermometer code for 3-bit binary number.

TABLE 1

| Binary number | | | Thermometer code | | | | | | |
|---|---|---|---|---|---|---|---|---|---|
| D3 | D3 | D1 | T7 | T6 | T5 | T4 | T3 | T2 | T1 |
| 0 | 0 | 0 | 0 | 0 | 0 | 0 | 0 | 0 | 0 |
| 0 | 0 | 1 | 0 | 0 | 0 | 0 | 0 | 0 | 1 |
| 0 | 1 | 0 | 0 | 0 | 0 | 0 | 0 | 1 | 1 |
| 0 | 1 | 1 | 0 | 0 | 0 | 0 | 1 | 1 | 1 |
| 1 | 0 | 0 | 0 | 0 | 0 | 1 | 1 | 1 | 1 |
| 1 | 0 | 1 | 0 | 0 | 1 | 1 | 1 | 1 | 1 |
| 1 | 1 | 0 | 0 | 1 | 1 | 1 | 1 | 1 | 1 |
| 1 | 1 | 1 | 1 | 1 | 1 | 1 | 1 | 1 | 1 |

The main digital-analog converter 142 has a segment typed digital-analog converter. Generally, the segment typed digital-analog converter has low noise characteristic. However, it takes long time for the converter to performing a converting operation. Therefore, the binary-thermometer code converter 141 is included for the segment typed digital-analog converter to save time.

The sub digital-analog converter 144 has a binary typed digital-analog converter.

The unit gain buffer 160 receives a signal outputted from the digital-analog converter 140, and outputs the received signal as the tracking voltage VT. The unit gain buffer 160 is embodied by using an operational amplifier.

The unit gain buffer 160 enhances a driving ability of an outputted signal from the digital-analog converter 140 because a capacitance of the capacitor, where the tracking voltage VT is stored, in the loop filter is very high.

Because there is time delay when the voltage comparator 110 compares the tracking voltage VT with the reference voltage VC, the tracking digital-analog converter 100 includes the delay for delaying a sampling clock used for operating the 8-bit binary up/down counter 120.

Figure 7:
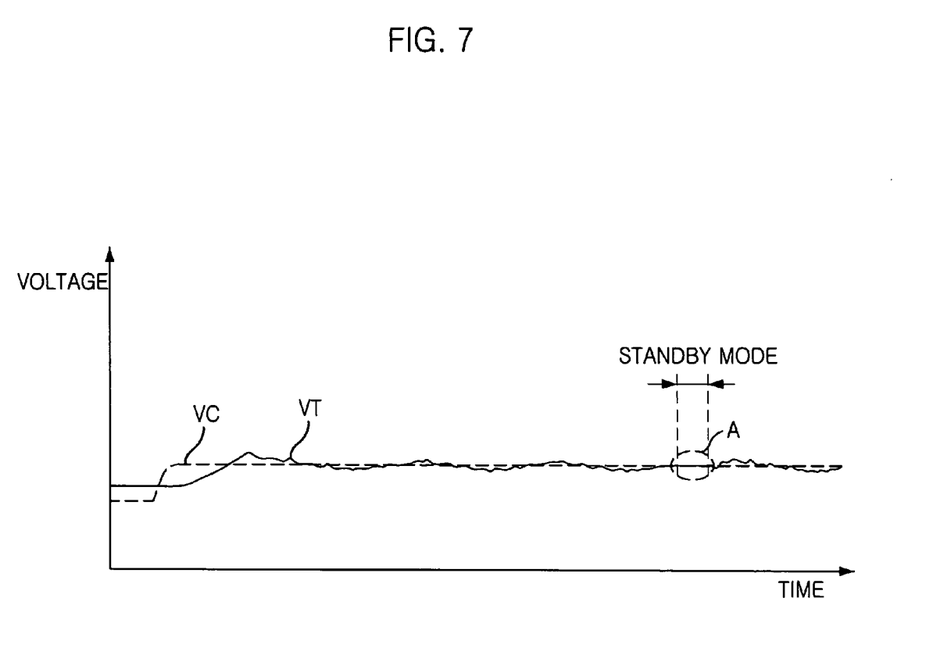
FIG. 7 is a wave graph showing operation of the analog DLL device shown in FIG. 5.

FIG. 7 is a wave graph showing an operation of the analog DLL device shown in FIG. 5.

Hereinafter, the operation of the embodiment of the analog DLL device is described referring to FIGS. 5, 6 and 7.

The input buffer 700 outputs the reference clock signal CKR after delaying the external clock signal CKIN, and the reference clock signal CKR is inputted to the phase comparator 300 and the voltage control delay line 200. Then, the reference clock is delayed by the delay line 200 for predetermined time, and is outputted as the feedback clock signal CKF. The outputted feedback clock signal CKF is inputted to the delay model 600. The delay model 600 is designed for modeling a delay time when the external clock signal CKIN takes during passing the input buffer 700.

The phase comparator 300 compares a phase of the reference clock signal CKR with a phase of the delay signal CKD outputted from the delay model 600, and thereby outputs an up signal UP or a down signal DOWN to the charge pump 400.

Thereafter, the charge pump 400 charges or discharges the capacitor (now shown) in the loop filter 500 depending on the up signal UP or the down signal DOWN. The reference voltage VC is generated by the loop filter 500, and the loop filter 500 outputs the generated reference voltage VC to the voltage control line 200, where the reference voltage VC is determined by charge quantity in the capacitor.

Then, the voltage control delay line 200 delays the reference clock signal CKR for delay time referenced on the reference voltage VC, and outputs the delayed reference clock signal CKR as the feedback clock signal CKF to the delay model 600.

Thereafter, the phase comparator 300 compares a phase of the reference clock CKR signal with a phase of the delay signal CKD outputted from the delay model 600, and outputs the up signal UP or the down signal DOWN to the charge pump 400 depending on the comparison result. This process is repeated until the phase of the reference clock signal CKR is synchronized with the phase of the delay signal CKD.

If the phase of the reference clock signal CKR and the phase of the delay signal CKD are in phase, the phase comparator 300 doesn't output the up signal UP or the down signal DOWN to the charge pump 400. Therefore, the reference voltage VC in the loop filter 500 is not changed.

Therefore, the voltage control delay line 200 is supplied with the reference voltage VC which has a predetermined value, and delays the reference clock signal CKR for a predetermined delay time depending on the predetermined reference voltage VC.

Thereafter, the voltage control delay line 200 outputs the feedback clock signal CKF which is the delayed reference clock signal CKR for the constant delay time, and the feedback clock signal CKF is inputted to an internal circuit of a semiconductor memory device.

The digital-analog converter 100 controls the tracking voltage VT to keep as a same voltage level as the reference voltage VC. This process is described in the followings.

The voltage comparator 110 compares the reference voltage VC with the tracking voltage VT; and stores the comparison result in a latch (not shown) included; and, then, outputs a second up signal UP1 and second down signal DOWN1 for the 8-bit binary up/down counter 120 depending on the compared result. The 8-bit binary up/down counter 120 outputs the 8-bit counting signal determined by the second up signal UP1 and the second down signal DOWN1, and the register 130 stores the outputted 8-bit counting signal.

Thereafter, the binary-thermometer code converter 141 converts upper 6 bits of 8-bit counting signal outputted from the 8-bit binary up/down counter 120 to a 64-bit thermometer code, and outputs the 64-bit thermometer code to the main digital-analog converter 142.

Thereafter, the main digital-analog converter 142 outputs a voltage signal corresponding to the 64-bit thermometer code to the unit gain buffer 160, and the unit gain buffer 160 buffers and outputs the outputted voltage signal as the tracking voltage signal VT.

Thereafter, the voltage comparator 110 compares the reference voltage VC with the tracking voltage VT again, and the process described above is repeated until the tracking voltage VT is equal to the reference voltage VC.

Referring to FIG. 7, the tracking voltage VT tracks the reference voltage VC. The tracking voltage VT continues to track the reference voltage VC until the analog DLL is locked. After the analog DLL is locked, the tracking voltage VT holds a predetermined value.

When the tracking voltage VT becomes equal to the reference voltage VC, the tracking voltage VT stops tracking the reference voltage VC, and the value of the tracking voltage VT is stored as a digital value in the 8-bit register 130.

The analog DLL device becomes standby mode when the analog DLL is locked, and all the blocks in the analog DLL device except the tracking digital-analog converter 140 become disabled.

During the standby mode, the voltage level of the reference voltage VC is reduced because of the leakage current of the capacitor in the loop filter 500.

However, in that case, since the tracking digital-analog converter 100 still operates and outputs the constant tracking voltage VT to the loop filter 500, the reference voltage VC can hold a predetermined voltage level. As shown in FIG. 7, the reference voltage VC holds a predetermined voltage level during the standby mode.

Therefore, when the analog DLL device operates again, it can complete its operation at high speed because the voltage value of the reference voltage VC is saved while the analog DLL is locked.

Meanwhile, if the tracking voltage VT is generated by using only the upper 6 bits of the 8-bit signal outputted from the 8-bit binary up/down counter 120, the tracking voltage VT can not be generated to be equal to the reference voltage VC.

The analog DLL device in accordance to the present invention generates the first tracking voltage VT by using the upper 6 bits of 8-bit signal outputted from the 8-bit binary up/down counter 120. Then, if the first tracking voltage VT becomes closely similar to the reference voltage VC, the lower 2 bits of the 8-bit signal outputted from the 8-bit binary up/down counter 120 are used to adjust the first tracking voltage VT to be exactly equal to the reference voltage VC.

That is, in the beginning of the operation of the analog DLL device, only the upper 6 bits of the 8-bit signal outputted from the 8-bit binary up/down counter 120 are used for tracking the reference voltage VC by operating the main digital-analog converter 142 because a voltage difference between the tracking voltage VT and the reference voltage VC is large. After the tracking voltage VT becomes close to the reference voltage VC, the sub digital-analog converter 144 is also activated so that the tracking voltage VT is same to the reference voltage VC.

There are two reasons why the 8-bit signal outputted from the 8-bit binary up/down counter 120 is divided into two signals: one is saving a tracking time; and the other is improving a precision of tracking.

Figure 8:
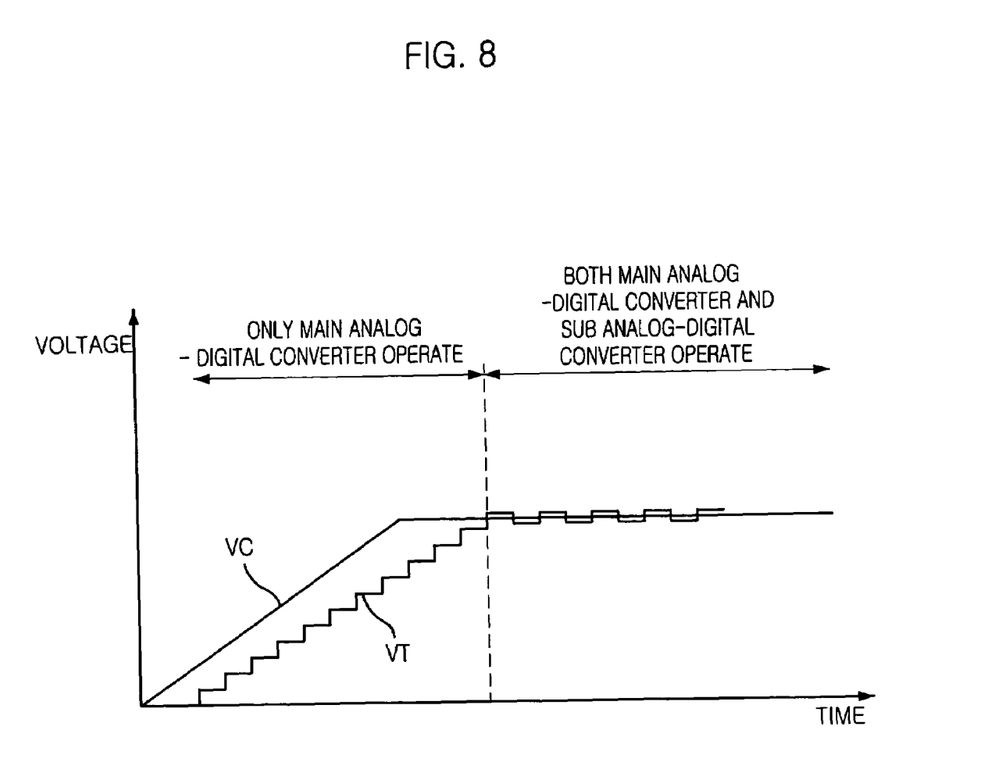
FIG. 8 is a wave graph showing an operation of a tracking analog-digital converter shown in FIG. 6.

FIG. 8 is a wave graph which shows the operation of the tracking digital-analog converter 100 in FIG. 6.

As shown, in the beginning of the operation, the main digital-analog converter 142 is activated for the tracking voltage VT to track the reference voltage VC, and if the tracking voltage VT becomes close to the reference voltage VC, the sub digital-analog converter 144 is also activated for the tracking voltage VT to be same as the reference voltage VC.

In case of the embodiment of the present invention described above, the tracking voltage VT is saved as an 8-bit digital value, but the number of bits can be changed for other embodiments. In addition, the 8-bit signal of the 8-bit binary up/down counter is divided into a 6-bit signal and a 2-bit signal, i.e., in the ratio of 6:2, but the ratio can be changed such as 5:3, 7:1 and so on for other embodiments.

Meanwhile, because the main digital-analog converter 141 is segment-typed and the sub digital-analog converter 144 is binary-typed, a switching noise generated during converting a digital value into an analog voltage can be reduced and a size of the tracking digital-analog converter 100 can be reduced.

The dummy converter 143 is for delaying lower 2 bits of an 8-bit signal outputted from the 8-bit binary up/down counter 120 because it takes a predetermined time to convert the upper 6-bit signal to the 64-bit thermometer code.

The switch S1 is used for transferring the tracking voltage VT to the loop filter 500 during the standby mode.

As described above, the analog DLL device in accordance to the present invention can save power during the standby mode because unessential blocks during the standby mode are disabled.

During the standby mode, only the unit gain buffer 160 and the main digital-analog converter 142 are still enabled, and when the analog DLL device becomes an operating mode, it can complete DLL operation quickly because the voltage value of the reference voltage VC is saved in the 8-bit register during the standby mode.

The reason why the unit gain buffer 160 and the main digital-analog converter 142 are not disabled during the standby mode is that, when the analog DLL device operates again, it takes relatively long time to generate the tracking voltage VT by using the digital value saved in the 8-bit register 130 if the unit gain buffer 160 and the main digital-analog converter 142 are disabled during the standby mode.

Figure 9:
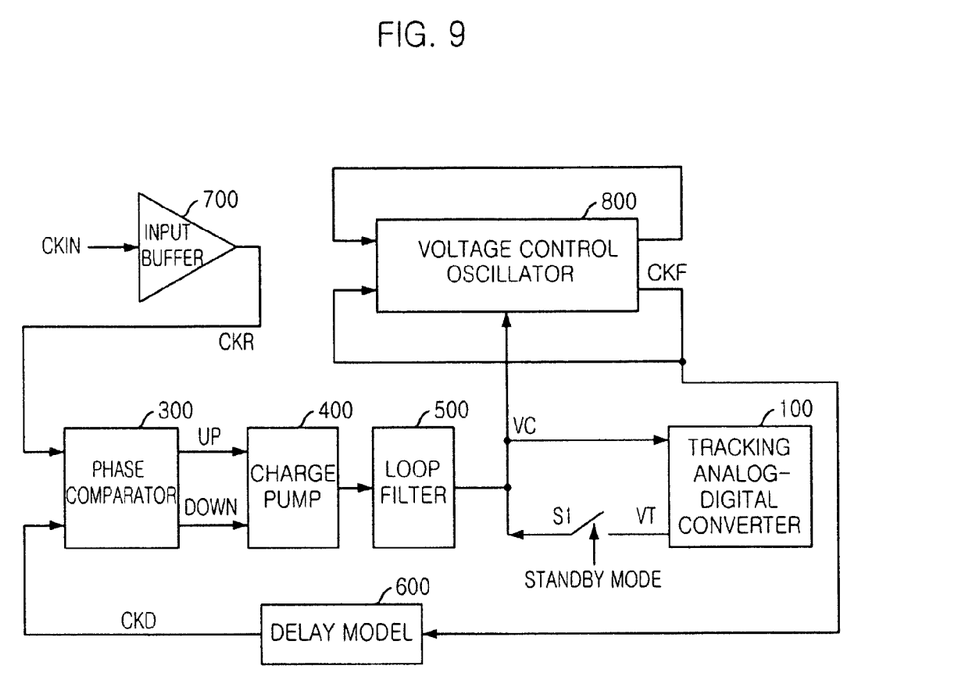
FIG. 9 is a block diagram of an analog phase locked loop (PLL) in accordance with the present invention

FIG. 9 is a block diagram depicting an analog phase locked loop (PLL) in accordance with another embodiment of the present invention. The analog PLL is closely similar to the analog DLL except that the analog PLL uses a voltage control oscillator instead of the voltage control delay line included in the analog DLL.

Referring to FIGS. 5 and 9, the analog PLL shown in FIG. 9 includes the voltage control oscillator 800 instead of the voltage control delay line 200 shown in FIG. 5.

The analog PLL in accordance to the present invention synchronizes an internal clock with an external clock by modulating a frequency of the feedback clock signal CKF depending on an outputted signal from the voltage control oscillator 800, where the outputted signal is determined by the reference voltage VC. All other operations of this analog PLL are the same as those of the analog DLL described above.

While the present invention has been described with respect to the particular embodiments, it will be apparent to those skilled in the art that various changes and modifications may be made without departing from the spirit and scope of the invention as defined in the following claims.

What is claimed is:

1. An analog DLL which buffers an external clock signal and uses the buffered clock signal as a reference clock signal, comprising:
    a delay model for delaying a delayed clock signal;
    a phase comparator for comparing a phase of the reference clock signal with an phase of an outputted signal from the delay model;
    a charge pump for pumping charges in response to an outputted signal from the phase comparator;
    a loop filter for generating a reference voltage which is determined by a quantity of charges inputted from the charge pump;

a voltage control delay line which delays the reference clock signal for a predetermined time, and outputs the delayed clock signal to the delay model, where the predetermined time is determined by the reference voltage; and a tracking analog-digital converter which converts the reference voltage to a digital value, and stores the digital value for keeping the reference voltage safely, and outputs a tracking voltage which corresponds to the digital value to the loop filter, wherein the tracking analog-digital converter includes:

a voltage comparator for comparing the reference voltage with the tracking voltage;

a counting means for counting in response to an outputted signal from the voltage comparator, and for outputting an counting signal;

a register for storing a digital value which corresponds to the counting signal; and a digital-analog converting means for generating a voltage which corresponds to the digital value, and for outputting the voltage as the tracking voltage.

2. The analog DLL as recited in claim 1, wherein the tracking voltage is outputted to the loop filter during a standby mode.

3. The analog DLL as recited in claim 2, wherein the loop filter includes a capacitor for storing the reference voltage.

4. The analog DLL as recited in claim 3, wherein the reference voltage is determined by charges pumped by the charge pump when the analog DLL is locked.

5. The analog DLL as recited in claim 2, wherein the digital-analog converting means includes:

a main digital-analog converter which generates a first tracking voltage for a high speed tracking, where the first tracking voltage corresponds to predetermined upper bits of the digital value; and a sub digital-analog converter which generates a second tracking voltage for correcting the first tracking voltage to be equal to the reference voltage, where the second tracking voltage corresponds to all the bits, except the predetermined upper bits, of the digital value.

6. The analog DLL as recited in claim 5, wherein the digital-analog converting means is provided with a binary-thermometer converter which converts the predetermined upper bits to a thermometer code, and outputs the converted thermometer code to the main digital-analog converter, where the main digital-analog converter is segment typed.

7. The analog DLL as recited in claim 2, a unit gain buffer is included for buffering an outputted signal from the main digital-analog converter and the sub digital-analog converter, and for outputting the buffered signal as the tracking voltage.

8. The analog DLL as recited in claim 7, a switch is included for transferring the tracking voltage outputted from the unit gain buffer to the loop filter.

9. The analog DLL as recited in claim 7, wherein all the blocks except the register, the digital-analog converting means and the unit gain buffer become disabled during the standby mode.

10. An analog phase locked loop (PLL) which buffers an external clock signal and uses the buffered clock signal as a reference clock signal, comprising:

a delay model for delaying a modulated signal;

a phase comparator for comparing a phase of the reference clock signal with an phase of an outputted signal from the delay model;

a charge pump for pumping charges in response to an outputted signal from the phase comparator;

a loop filter for generating a reference voltage which is determined by a quantity of charges inputted from the charge pump;

a voltage control oscillator which modulates a frequency of the reference clock signal, and outputs the modulated signal to the delay model; and a tracking analog-digital converter which converts the reference voltage to a digital value, and stores the digital value for keeping the reference voltage safely, and outputs a tracking voltage which corresponds to the digital value to the loop filter, wherein the tracking analog-digital converter includes:

a voltage comparator for comparing the reference voltage with the tracking voltage;

a counting means for counting in response to an outputted signal from the voltage comparator, and for outputting an counting signal;

a register for storing a digital value which corresponds to the counting signal; and a digital-analog converting means for generating a voltage which corresponds to the digital value, and for outputting the voltage as the tracking voltage.

11. The analog PLL as recited in claim 10, wherein the tracking voltage is outputted to the loop filter during a standby mode.

12. The analog PLL as recited in claim 11, a unit gain buffer is included for buffering an outputted signal from the main digital-analog converter and the sub digital-analog converter, and for outputting the buffered signal as the tracking voltage.

13. The analog PLL as recited in claim 12, a switch is included for transferring the tracking voltage outputted from the unit gain buffer to the loop filter.

14. The analog PLL as recited in claim 12, wherein all the blocks except the register, the digital-analog converting means and the unit gain buffer become disabled during the standby mode.

15. The analog DLL as recited in claim 11, wherein the digital-analog converting means includes:

a main digital-analog converter which generates a first tracking voltage for a high speed tracking, where the first tracking voltage corresponds to predetermined upper bits of the digital value; and a sub digital-analog converter which generates a second tracking voltage for correcting the first tracking voltage to be equal to the reference voltage, where the second tracking voltage corresponds to all the bits, except the predetermined upper bits, of the digital value.

16. The analog PLL as recited in claim 15, wherein the digital-analog converting means is provided with a binary-thermometer converter which converts the predetermined upper bits to a thermometer code, and outputs the converted thermometer code to the main digital-analog converter, where the main digital-analog converter is segment typed.

17. The analog PLL as recited in claim 11, wherein the loop filter includes a capacitor for storing the reference voltage.

18. The analog PLL as recited in claim 17, wherein the reference voltage is determined by charges pumped by the charge pump when the analog PLL is locked.

* * * * *